United States Patent
Kawakita et al.

(10) Patent No.: US 12,068,552 B2
(45) Date of Patent: Aug. 20, 2024

(54) CIRCUIT BOARD ASSEMBLY

(71) Applicant: Hitachi Astemo, Ltd., Hitachinaka (JP)

(72) Inventors: Shinya Kawakita, Tokyo (JP); Shiro Yamashita, Hitachinaka (JP); Toshikazu Shigyo, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 415 days.

(21) Appl. No.: 17/632,918

(22) PCT Filed: Jun. 5, 2020

(86) PCT No.: PCT/JP2020/022393
§ 371 (c)(1),
(2) Date: Feb. 4, 2022

(87) PCT Pub. No.: WO2021/024601
PCT Pub. Date: Feb. 11, 2021

(65) Prior Publication Data
US 2022/0271453 A1    Aug. 25, 2022

(30) Foreign Application Priority Data
Aug. 5, 2019   (JP) .................................. 2019-144052

(51) Int. Cl.
*H01R 12/58*    (2011.01)
*H05K 1/02*     (2006.01)
*H05K 1/11*     (2006.01)

(52) U.S. Cl.
CPC ......... *H01R 12/585* (2013.01); *H05K 1/0271* (2013.01); *H05K 1/116* (2013.01);
(Continued)

(58) Field of Classification Search
CPC ......... H01R 12/585; H05K 2201/1059; H05K 1/0271; H05K 1/116; H05K 1/115;
(Continued)

(56) References Cited

U.S. PATENT DOCUMENTS 3,792,412 A  *  2/1974  Madden .............. H01R 12/718
                                                        439/82
10,027,048 B2 *  7/2018  Ochi .................... H01R 12/585
(Continued)

FOREIGN PATENT DOCUMENTS

JP     2005-286209 A     10/2005
JP     2016-46270 A      4/2016
(Continued)

OTHER PUBLICATIONS

International Search Report (PCT/ISA/210) issued in PCT Application No. PCT/JP2020/022393 dated Sep. 8, 2020 with English translation (four (4) pages).
(Continued)

*Primary Examiner* — Renee S Luebke
*Assistant Examiner* — Paul D Baillargeon
(74) *Attorney, Agent, or Firm* — Crowell & Moring LLP

(57) ABSTRACT

A circuit board including a through-hole into which a press-fit terminal portion is inserted in a depth direction; an inner wall land provided on an inner wall of the through-hole; and a plurality of inner layer lands which are provided in an inner layer of the circuit board, are planes substantially parallel to a mounting surface of the circuit board, and are in contact with the inner wall land. The inner wall land has a first region that is in contact with the press-fit terminal portion and a second region that is not in contact with the press-fit terminal portion. Among the plurality of inner layer lands, a first inner layer land, which is an inner layer land disposed on an identical surface with the first region of the inner wall land, is wider than a second inner layer land which is an inner layer land disposed on an identical surface with the second region of the inner wall land.

6 Claims, 8 Drawing Sheets

(52) U.S. Cl.
CPC ............. *H05K 2201/10189* (2013.01); *H05K 2201/10303* (2013.01); *H05K 2201/1059* (2013.01)

(58) Field of Classification Search
CPC .......... H05K 2201/10303; H05K 2201/10189; H05K 1/117
USPC ................................................ 174/262, 266
See application file for complete search history.

(56) References Cited

U.S. PATENT DOCUMENTS

| | | | |
|---|---|---|---|
| 10,403,990 B2 * | 9/2019 | Ochi | ..................... H01R 43/16 |
| 2017/0077627 A1 | 3/2017 | Matsumoto et al. | |
| 2018/0183160 A1 | 6/2018 | Shiomi | |

FOREIGN PATENT DOCUMENTS

| | | |
|---|---|---|
| JP | 2016-219595 A | 12/2016 |
| JP | 2017-59587 A | 3/2017 |
| JP | 2018-107276 A | 7/2018 |
| JP | 2004-356180 A | 12/2018 |

OTHER PUBLICATIONS

Japanese-language Written Opinion (PCT/ISA/237) issued in PCT Application No. PCT/JP2020/022393 dated Sep. 8, 2020 (four (4) pages).

* cited by examiner

CIRCUIT BOARD ASSEMBLY

TECHNICAL FIELD

The present invention relates to a circuit board.

BACKGROUND ART

For example, an electronic control device for engine control, motor control, automatic transmission control, or the like is mounted on a vehicle such as an automobile. The electronic control device includes a connector for exchanging signals and power with a device to be controlled or the like. There is an electronic control device including a press-fit terminal portion as a connection terminal of a connector. The press-fit terminal portion is mechanically fixed by being press-fit into a through-hole provided in a circuit board, and is electrically connected to a wiring of the circuit board by coming into contact with a wall surface of an insertion hole. PTL 1 discloses an element device including a base material, a conductive portion formed on the base material, and a through-hole bored in the base material and having an outer edge at least partially exposing the conductive portion, the conductive portion being electrically connected to a terminal portion when the terminal portion is press-fit into the through-hole. In the element device, a hard reinforcing portion is integrally formed with the base material in an inner layer of the base material located at a peripheral edge of the through-hole.

CITATION LIST

Patent Literature

PTL 1: JP 2005-286209 A

SUMMARY OF INVENTION

Technical Problem

The invention described in PTL 1 has room for improvement from a viewpoint of reducing the maximum principal stress.

Solution to Problem

A circuit board according to a first aspect of the present invention is a circuit board having a through-hole into which a press-fit terminal portion is inserted in a depth direction, and includes an inner wall land provided on an inner wall of the through-hole, and a plurality of inner layer lands which are provided in an inner layer of the circuit board, are planes substantially parallel to a mounting surface of the circuit board, and are in contact with the inner wall land. The inner wall land has a first region that is in contact with the press-fit terminal portion and a second region that is not in contact with the press-fit terminal portion. Among the plurality of inner layer lands, a first inner layer land, which is an inner layer land disposed on the same surface as the first region of the inner wall land, is wider than a second inner layer land which is an inner layer land disposed on the same surface as the second region of the inner wall land.

Advantageous Effects of Invention

According to the present invention, the maximum principal stress can be reduced. Other objects, configurations, and effects which have not been described above become apparent from modes for carrying out the invention to be described hereinafter.

DESCRIPTION OF EMBODIMENTS

Figure 1:
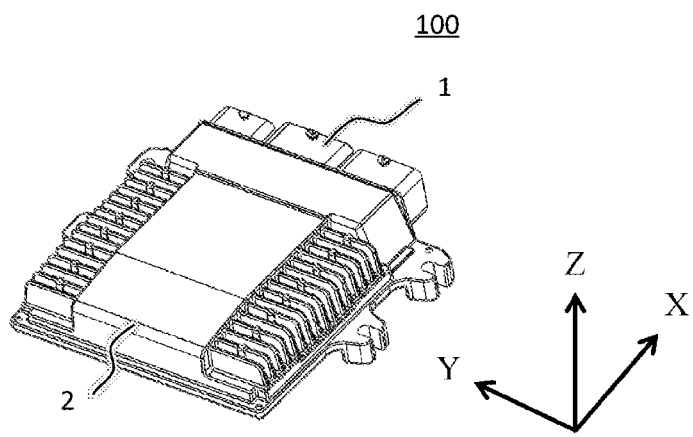
FIG. 1 is an external perspective view of an electronic control device in a first embodiment.

Hereinafter, embodiments of the present invention will be described with reference to the drawings. The embodiments are examples given to describe the invention, and are appropriately omitted and simplified for clarification of the description. The present invention can be implemented in various other forms. Each component may be singular or plural unless specifically limited. Positions, sizes, shapes, ranges, and the like of the respective components illustrated in the drawings do not always indicate actual positions, sizes, shapes, ranges and the like in order to facilitate understanding of the invention. Therefore, the present invention is not necessarily limited to the positions, sizes, shapes, ranges, and the like disclosed in the drawings.

First Embodiment

Hereinafter, a first embodiment of a circuit board according to the present invention will be described with reference to FIGS. 1 to 4. In the first embodiment, an example in which the present invention is applied to the circuit board which is a part of an electronic control device is adopted as an example.

Figure 2:
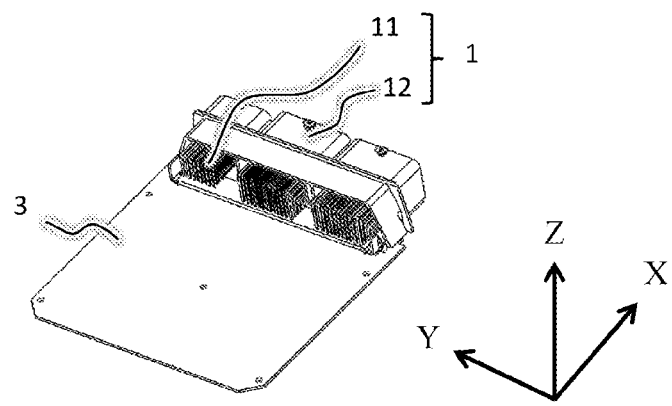
FIG. 2 is an external perspective view illustrating a connector 1 and a circuit board 3 (in which a surface layer wiring of the circuit board 3 is not illustrated) of an electronic control device 100 illustrated in FIG. 1.
Figure 3:
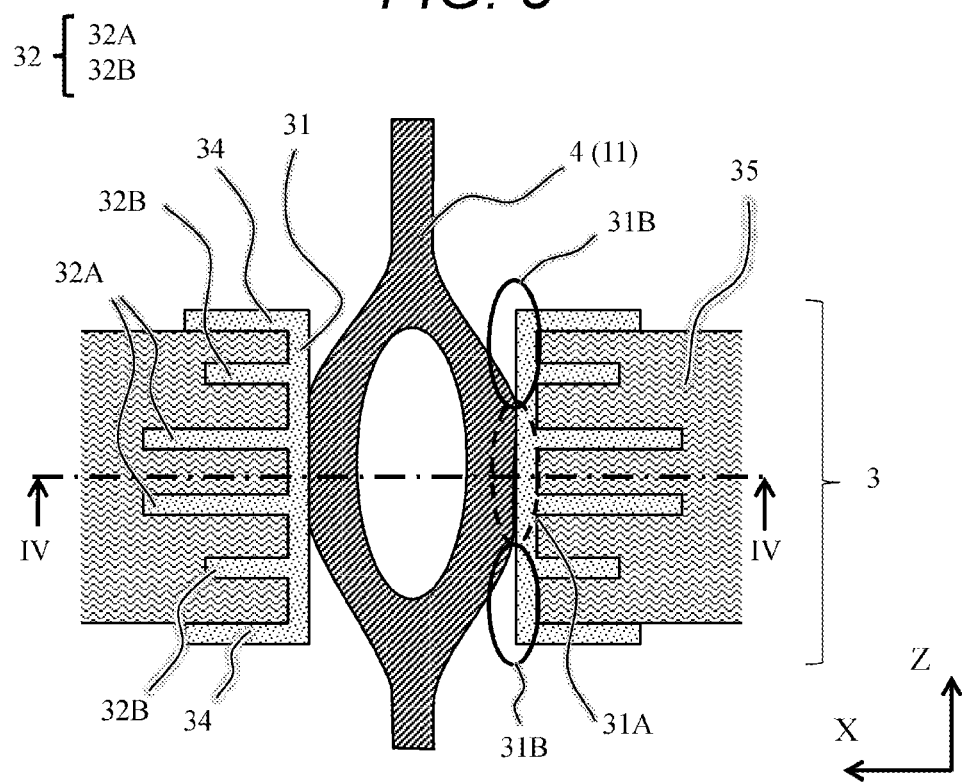
FIG. 3 is a cross-sectional view of the vicinity of a through-hole of a circuit board into which a press-fit terminal portion is press-fit.

FIG. 1 is an external perspective view of an electronic control device 100 in the first embodiment. FIG. 2 is an external perspective view illustrating a connector 1 and a circuit board 3 (in which a surface layer wiring of the circuit board 3 is not illustrated) of the electronic control device 100 illustrated in FIG. 1. FIG. 3 is a cross-sectional view of the circuit board 3, and more specifically, is an enlarged cross-sectional view of a connection portion between the circuit board 3 of the electronic control device 100 and a press-fit terminal portion 4 of a connector pin 11. As illustrated in FIG. 1, the electronic control device 100 includes the connector 1 and a base 2. The electronic control device 100 has a casing having a substantially box shape with a cover (not illustrated) and the base 2. The base 2 and the cover (not illustrated) are fixed by a fastening member (not illustrated) such as a screw. Note that XYZ axes are illustrated in each drawing for the sake of convenience in order to illustrate mutual relationships.

The base 2 is formed of a member having excellent thermal conductivity, such as aluminum, for example, ADC12. The base 2 has a side wall in the periphery thereof, and is formed in a substantially box shape that is open on a lower side, that is, a cover side. A board fixing portion (not illustrated) protruding toward the circuit board 3 is provided on a surface of the base 2 opposite to a surface having a heat dissipation fin 5. The circuit board 3 is fixed to an end surface of the board fixing portion with a screw (not illustrated) or the like.

In the connector 1, connector pins 11 are assembled to connector housings 12, made of a thermosetting resin containing glass fiber, by press fitting, insert molding, or the like. A hole or a notch for insertion of the connector 1 is formed in the side wall of the base 2. Through this hole or notch, the connector pin 11 of the connector 1 is connected to a wiring (not illustrated) formed in the circuit board 3. The press-fit terminal portion 4 provided at a distal end of the connector pin 11 has a spring-like structure.

The press-fit terminal portion 4 of the connector pin 11 is mechanically connected by press-fitting into a through-hole of the circuit board 3, and an inner wall land 31 provided on an inner wall of the through-hole of the circuit board 3 and the press-fit terminal portion 4 of the connector pin 11 are electrically connected by pressure contact. Power and control signals between the outside and the electronic control device 100 and data from various sensors mounted on a vehicle are transmitted and received via the connector 1.

The cover (not illustrated) may be made of a material having an excellent thermal conductivity, such as aluminum, similarly to the base 2, or can be made of sheet metal such as a steel material or a material having a lower thermal conductivity than the base 2, such as a resin material, to achieve cost reduction.

FIG. 2 is an external perspective view illustrating the connector 1 and the circuit board 3 (in which the surface layer wiring of the circuit board 3 is not illustrated) of the electronic control device 100 illustrated in FIG. 1. The circuit board 3 has an electronic component mounting region on which a plurality of electronic components (not illustrated) are mounted and a terminal portion region to which the plurality of connector pins 11 are connected.

FIG. 3 is a cross-sectional view of the vicinity of the through-hole of the circuit board 3 into which the press-fit terminal portion 4 is press-fit, in the terminal portion region of the electronic control device illustrated in FIG. 1. FIG. 3 can also be said to be an enlarged cross-sectional view of a press-fit connection portion. The circuit board 3 is formed of, for example, a laminate 35 of an organic material such as epoxy resin and an inorganic material such as glass cloth. The circuit board 3 is a multilayer board having inner layer lands 32 and surface layer lands 34. In the circuit board 3, the inner wall land 31 is formed on the inner wall of the through-hole into which the press-fit terminal portion 4 of the connector pin 11 is press-fit. A surface of the circuit board 3, that is, a mounting surface is substantially parallel to an XY plane. Since the through-hole is formed in a Z-direction, hereinafter, the Z-direction is also referred to as a "depth direction".

The inner wall land 31, the inner layer land 32, and the surface layer land 34 are made of copper. As illustrated in FIG. 3, a diameter of the inner layer land 32 in a contact region between the press-fit terminal portion 4 of the connector pin 11 and the inner wall land 31 is larger than a diameter in the other lands in the circuit board 3 of the present embodiment. Although not illustrated, passive elements, such as a coil and a capacitor, are also mounted on the circuit board 3 in addition to a microcomputer, a memory, and a power supply IC, and a wiring connecting these electronic components and the connector 1 is also formed. The circuit board 3 includes the through-hole through which the press-fit terminal portion 4 of the connector pin 11 passes. As the press-fit terminal portion 4 of the connector pin 11 is press-fit into the through-hole, the circuit board 3 and the press-fit terminal portion 4 of the connector pin 11 are connected by press fitting.

The circuit board 3 includes the inner wall land 31 provided on the inner wall of the through-hole, and the plurality of inner layer lands 32 provided on the inner layer of the circuit board 3 and in contact with the inner wall land 31. The inner wall land 31 is classified into a first region 31A that is in contact with the press-fit terminal portion 4 of the connector pin 11 and a second region 31B that is not in contact with the press-fit terminal portion 4.

The inner layer lands 32 are classified into a first inner layer land 32A and a second inner layer land 32B. Both the first inner layer land 32A and the second inner layer land 32B are planes substantially parallel to the mounting surface of the circuit board 3. Note that the term "substantially parallel" means parallelism to such an extent that adjacent inner layer lands do not come into contact with each other, and strict parallelism is not an essential requirement. The first inner layer land 32A and the second inner layer land 32B have the same thickness. The first inner layer land 32A is wider than the second inner layer land 32B, and has a larger spread on the XY plane. The first inner layer land 32A is disposed on the same XY plane as the first region 31A of the inner wall land 31. The second inner layer land 32B is disposed on the same XY plane as the second region 31B of the inner wall land 31.

As illustrated in FIG. 3, the circuit board 3 in the present embodiment has a total of six layers including two surface layer lands 34, two first inner layer lands 32A, and two second inner layer lands 32B. Note that the horizontal direction in the drawing is an X-axis in FIG. 3, but the drawing is the same even if the horizontal direction is changed to a Y-axis.

Figure 4:
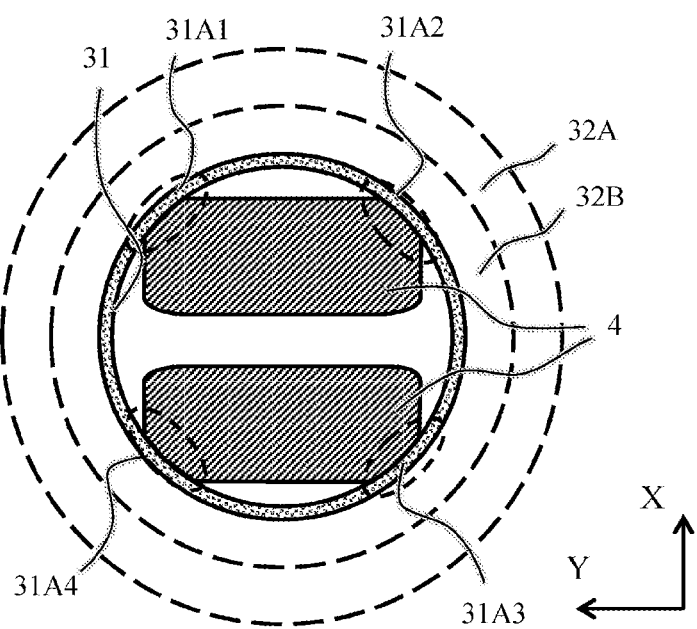
FIG. 4 is a view illustrating a positional relationship between an inner wall land and the press-fit terminal portion.

FIG. 4 is a view illustrating a positional relationship between the inner wall land 31 and the press-fit terminal portion 4 of the connector pin 11, and is a cross-sectional view taken along line IV-IV in FIG. 3. As illustrated in FIG. 4, the press-fit terminal portion 4 is in contact with the inner wall land 31 at four points. That is, the first region 31A includes a first region 31A1 at the upper left in the drawing, a first region 31A2 at the upper right in the drawing, a first region 31A3 at the lower right in the drawing, and a first region 31A4 at the lower left in the drawing.

Note that FIG. 4 also illustrates a shape of the inner layer land 32. The first inner layer land 32A and the second inner layer land 32B have a hollow circular shape, a so-called donut shape. Since the first inner layer land 32A is larger in area than the second inner layer land 32B, the first inner layer land 32A has a larger radius than the second inner layer land 32B.

An example of a method for manufacturing the electronic control device 100 will be described. First, a bonding material (not illustrated) is formed on the circuit board 3 by screen printing or the like. Electronic components are mounted on the printed bonding material by a mounting machine. The resultant in this state is put into a reflow furnace. The bonding material is melted and solidified during reflow, whereby the electronic components are mounted on the circuit board 3.

After the electronic components are mounted, the press-fit terminal portion 4 at the distal end of the connector pin 11 of the connector 1 is press-fit into the through-hole provided in the circuit board 3 using an insertion device. The press-fit terminal portion 4 of the connector pin 11 has a hollow portion. When the press-fit terminal portion 4 is press-fit into the through-hole to compress the hollow portion, the press-fit terminal portion 4 is held in the through-hole by restoring action. In addition, the press-fit terminal portion 4 can be inserted using a dedicated device, and the amount of insertion can be set in advance.

Next, the circuit board 3 on which the electronic components and the connector 1 are mounted is attached to the fixing portion of the base 2 using a screw or the like. In a case where there is a component having a large amount of heat generation or a component having poor heat dissipation among the electronic components mounted on the circuit board 3, a protrusion may be formed to extend from the base 2 toward the electronic component, and the protrusion of the base 2 may be coated with a thermally conductive member. In addition, in a case where the electronic control device 100 is imparted with waterproofness, an adhesive or the like may be applied to a portion where the connector 1 is in contact with the base 2 and a portion where the base 2 is in contact with the cover. Finally, the electronic control device 100 is obtained by assembling the cover (not illustrated) to the base 2 using a fastening member (not illustrated).

In a case where the thermally conductive member (not illustrated) and the adhesive (not illustrated) are of a thermosetting type, each member may be applied and then cured by causing the electronic control device to pass through a heating furnace. Alternatively, one heating step may be provided at the end for simultaneous curing.

Example 1 and Comparative Example 1

The maximum principal stress generated in the glass cloth of the circuit board 3 is compared between Example 1 and Comparative Example 1. First, a configuration common to Example 1 and Comparative Example 1 will be described. Both Example 1 and Comparative Example 1 have the configurations illustrated in FIGS. 1, 2, and 4. In addition, the connector housing 12, which is made of poly-butylene terephthalate (PBT) containing 30% of glass cloth and formed by press-fitting 128 connector pins 11 each of which is made of a copper alloy having a thermal conductivity of 121 W/(m·K) and an elastic modulus of 110 GPa, was used in each of the connectors 1 of Example 1 and Comparative Example 1. The press-fit terminal portion 4 of the connector pin 11 has a so-called needle eye shape having an O-shaped hole at the center.

In both Example 1 and Comparative Example 1, ADC12 having a thermal conductivity of 96 W/(m·K) was used as the base 2. Molding was performed by forging, and the heat dissipation fin was also integrally molded. Further, for the cover (not illustrated), a steel plate having a thermal conductivity of 65 W/(m·K) was press-molded. The circuit board 3 was made of an FR4 material having an area of 200 mm×140 mm and a thickness of 1.6 mm. Note that the inner wall land 31 was made of Cu formed by plating with an average plating thickness of 38 μm. In addition, the inner layer land 32 had an average thickness of 35 μm. In Example 1, a substrate having a total of six layers including two surface layer lands 34 and four inner layer lands 32 on the surface of the circuit board 3 was used as illustrated in FIG. 3.

Figure 5:
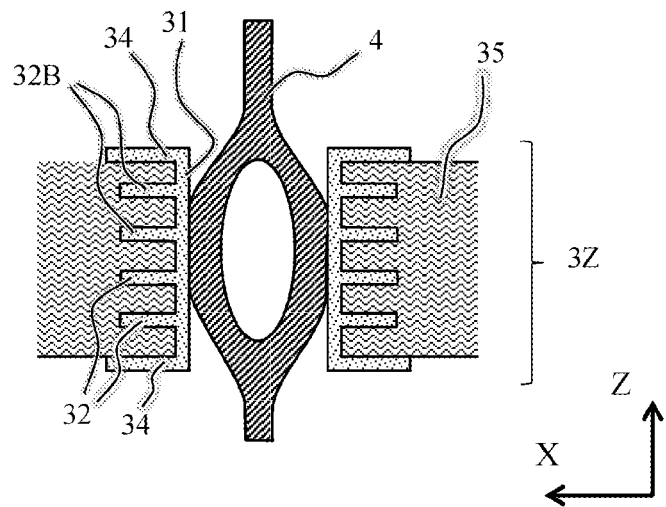
FIG. 5 is a cross-sectional view of Comparative Example 1.

Next, differences between Example 1 and Comparative Example 1 will be described. An enlarged view of a press-fit portion is illustrated in FIG. 3 in Example 1, but is illustrated in FIG. 5 described below in Comparative Example 1. As illustrated in FIG. 5, a circuit board 3Z in Comparative Example 1 is different from that in Example 1 in that inner layer lands include only second inner layer lands 32B. That is, the areas of all the inner layer lands 32 are the same in Comparative Example 1. Other configurations of Comparative Example 1 are the same as those of Example 1.

Figure 6:
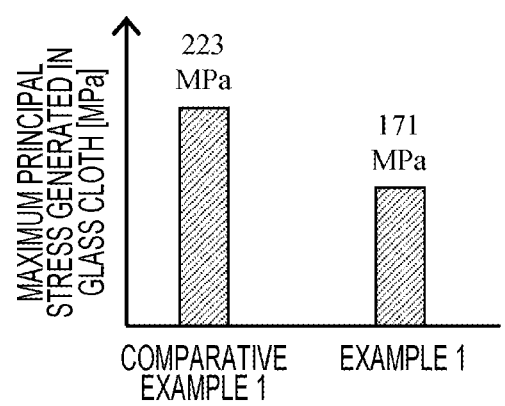
FIG. 6 is a graph illustrating the maximum principal stress in Example 1 and Comparative Example 1.

FIG. 6 is a graph illustrating the maximum principal stress generated on the glass cloth of the circuit board 3 when the press-fit terminal portion 4 of the connector pin 11 is press-fit into the through-hole of the circuit board 3. As illustrated in FIG. 6, the maximum principal stress generated in the glass cloth of the circuit board 3 of Example 1 is smaller than the maximum principal stress generated in glass cloth of the circuit board 3 of Comparative Example 1.

According to the above-described first embodiment, the following operational effects can be obtained.

(1) The circuit board 3 has the through-hole into which the press-fit terminal portion 4 is inserted in the depth direction. The circuit board 3 includes the inner wall land 31 provided on the inner wall of the through-hole, and the plurality of inner layer lands 32 which are provided on the inner layer of the circuit board 3, are planes substantially parallel to the mounting surface of the circuit board 3, and are in contact with the inner wall land 31. The inner wall land 31 has the first region 31A that is in contact with the press-fit terminal portion 4 and the second region 31B that is not in contact with the press-fit terminal portion 4. Among the plurality of inner layer lands 32, the first inner layer land 32A disposed on the same surface as the first region 31A of the inner wall land 31 is wider than the second inner layer land 32B disposed on the same surface as the second region 31B of the inner wall land 31.

When the through-hole of the circuit board 3 is formed by a drill, an initial defect such as a crack sometimes occurs in the glass cloth of the circuit board 3. When the press-fit terminal portion 4 of the connector pin 11 having a press-fit pin shape is press-fit into the through-hole of the circuit board 3 having the initial defect, the glass cloth continues to receive stress via the inner wall land 31. When the circuit board 3 is applied to an in-vehicle electronic control device, there is a case where the circuit board 3 is used for a long period of time, for example, 10 years or more so that the initial defect develops and the insulation quality of the circuit board deteriorates. However, in the circuit board 3 according to the present embodiment, the apparent elastic modulus can be enhanced by widening the area of the inner layer land 32A, and the maximum principal stress generated in the glass cloth can be reduced, and thus, the progress of whitening, which is the progress of the initial defect, can be suppressed.

Modification 1 of First Embodiment

In the first embodiment described above, the press-fit terminal portion 4 is in contact with the inner wall land 31 at four points as illustrated in FIG. 4. However, the press-fit terminal portion 4 may have a positive cross-sectional shape and be in contact with the inner wall land 31 at 8 points. That is, the press-fit terminal portion 4 may have any shape.

Modification 2 of First Embodiment

In the first embodiment described above, the inner layer land 32 is parallel to the mounting surface of the circuit board 3. However, the inner layer land 32 may be connected to a layer adjacent in the Z-direction as in a build-up substrate. That is, the inner layer land 32 is not necessarily parallel to the mounting surface of the circuit board 3.

Modification 3 of First Embodiment

In the first embodiment described above, the press-fit terminal portion 4 is inserted into the through-hole such that the first region 31A is located substantially at the center of the circuit board 3 in the depth direction. However, the position of the press-fit terminal portion 4 is not limited, and for example, the first region 31A may be located at the end of the circuit board 3 in the depth direction.

Modification 4 of First Embodiment

In the first embodiment described above, the circuit board 3 including four layers of the inner layer lands 32, that is, a six-layer board is used. However, the number of the inner layer lands 32 is not limited, and for example, the circuit board 3 having six layers of the inner layer lands 32, that is, an 8-layer board may be used.

Second Embodiment

A second embodiment of the circuit board according to the present invention will be described with reference to FIGS. 7 to 11. In the following description, a difference will mainly be described by applying the same reference signs to the same constituent elements as those of the first embodiment. A point not specifically described is the same as that of the first embodiment. The present embodiment is different from the first embodiment mainly in that a position of a lead wire, which will be described later, is specified.

Figure 7:
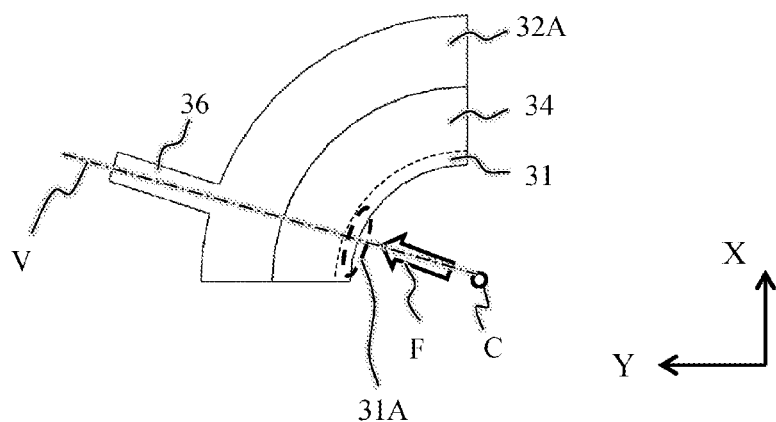
FIG. 7 is a perspective view of a circuit board 3 in a second embodiment.
Figure 8:
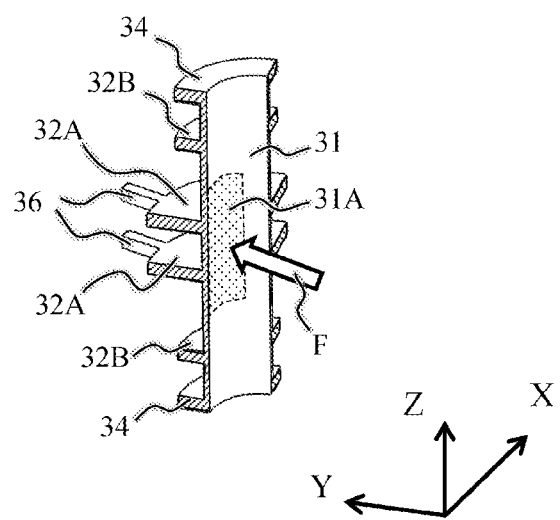
FIG. 8 is a perspective view of FIG. 7 as viewed obliquely from above.

FIG. 7 is a perspective view of the circuit board 3 in the second embodiment. Specifically, only the inner wall land 31, the first inner layer land 32A, the second inner layer land 32B, the surface layer land 34, and a lead wire 36 are cut out by 90 degrees and displayed in FIG. 7. FIG. 7 further illustrates a direction of a force by which the press-fit terminal portion 4 of the connector pin 11 pushes the inner wall land 31, an axial center C of the press-fit terminal portion 4, and the first region 31A. FIG. 7 is obtained by the same viewpoint as FIG. 4 in the first embodiment. Reference sign F in FIG. 7 indicates the direction of the force by which the press-fit terminal portion 4 pushes the inner wall land 31. A line segment V is a line segment connecting the axial center C of the press-fit terminal portion 4 and a circumferential center of the first region 31A. FIG. 8 is a perspective view of FIG. 7 as viewed obliquely from above.

The circuit board 3 of the second embodiment has the lead wire 36 extending from an outer periphery of the first inner layer land 32A substantially in parallel with the direction of the force by which the press-fit terminal portion 4 of the connector pin 11 pushes the inner wall land 31. Other configurations of the second embodiment are similar to those of the first embodiment, and corresponding configurations will be denoted by the same reference signs, and description thereof will be omitted. Note that the circuit board 3, which is made of the same material and having the same dimensions as those of Example 1 described in the first embodiment and has the lead wire 36 arranged as described above, is referred to as "Example 2" hereinafter.

Comparative Example 2

Figure 9:
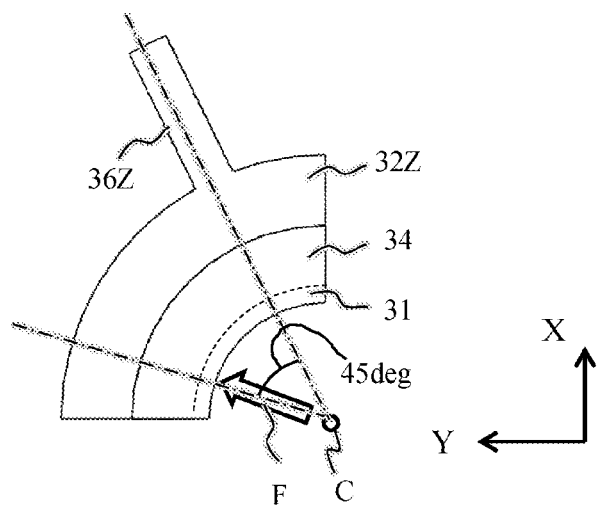
FIG. 9 is a view illustrating a configuration of Comparative Example 2.
Figure 10:
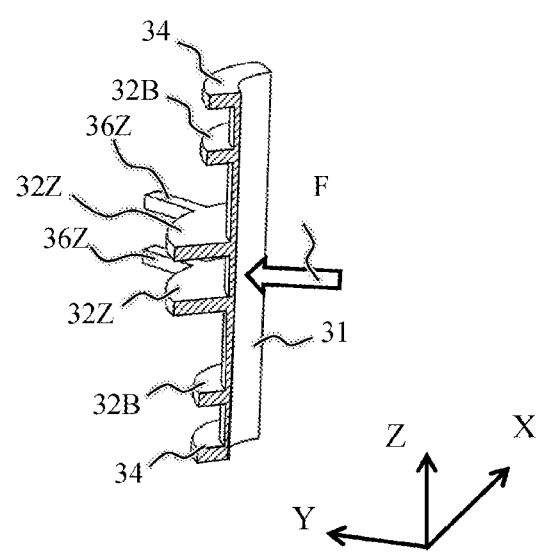
FIG. 10 is a perspective view of FIG. 9 as viewed obliquely from above.

FIG. 9 is a view illustrating a configuration of Comparative Example 2, which is a comparative example in the second embodiment, and corresponds to FIG. 7 in the second embodiment. FIG. 10 is a perspective view of FIG. 9 as viewed obliquely from above, and corresponds to FIG. 8 in the second embodiment. As illustrated in FIGS. 9 and 10, a position of a lead wire 36Z is different when Comparative Example 2 is compared with the second embodiment. Specifically, an angle formed by a direction F of a force by which a press-fit terminal portion 4 of a connector pin 11 pushes an inner wall land 31 and the lead wire 36Z extending from an outer periphery of an inner layer land 32 is about 45 degrees. The other configurations are the same as those of Example 2

Figure 11:
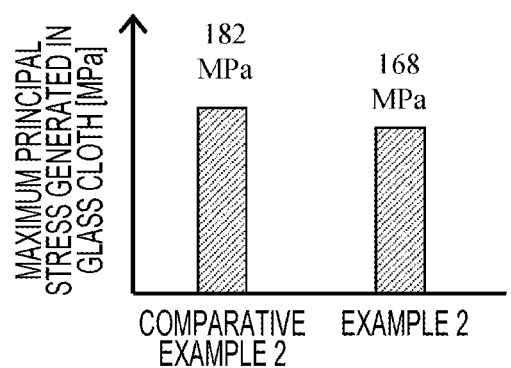
FIG. 11 is a graph illustrating the maximum principal stress in Example 2 and Comparative Example 2.

FIG. 11 is a graph illustrating the maximum principal stress generated in glass cloth in Example 2 and Comparative Example 2. As illustrated in FIG. 11, since the maximum principal stress of Example 2 is lower than that of Comparative Example 2, it can be confirmed that there is an effect of reducing the maximum principal stress by devising the arrangement of the lead wire 36.

According to the above-described second embodiment, the following operational effect can be obtained in addition to the effects of the first embodiment.

(2) The lead wire 36 electrically connected to the first inner layer land 32A extends in an extending direction of the line segment V connecting the axial center of the press-fit terminal portion 4 and the circumferential center of the first region 31A on a surface substantially parallel to the mounting surface of the circuit board 3. Therefore, the direction in which the lead wire 36 extends from the inner layer land 32 and the direction of the force by which the press-fit terminal portion 4 of the connector pin 11 presses the inner wall land 31 are substantially parallel, and thus, the apparent elastic modulus of the circuit board 3 is high in the direction in which the force acts. Therefore, the maximum principal stress generated in the glass cloth of Example 2 can be made lower than the maximum principal stress generated in the glass cloth of the circuit board of Comparative Example 2 as illustrated in FIG. 11, and an effect of suppressing the progress of whitening can be obtained.

Third Embodiment

A third embodiment of the circuit board according to the present invention will be described with reference to FIGS. 12 and 13. In the following description, a difference will mainly be described by applying the same reference signs to the same constituent elements as those of the first embodiment. A point not specifically described is the same as that of the first embodiment. The present embodiment is different from the first embodiment mainly in that a circumferential range of first inner layer land 32A is specified. As illustrated in FIG. 4, the first inner layer land 32A has a donut shape and exists in the entire circumferential direction in the first embodiment. In the third embodiment, however, the first inner layer land 32A exists only in a part in the circumferential direction.

Figure 12:
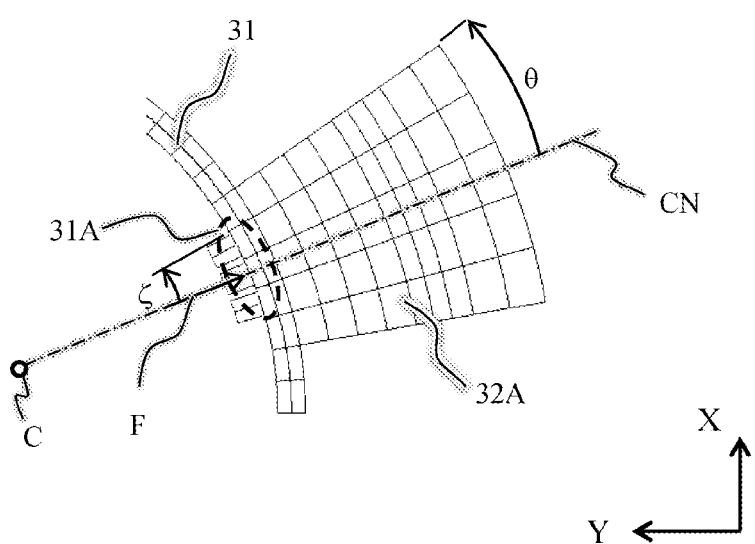
FIG. 12 is a view illustrating circumferential position and range of a first inner layer land in a third embodiment.

FIG. 12 is a view illustrating circumferential position and range of the first inner layer land 32A. In FIG. 12, a center of the press-fit terminal portion 4 on the XY plane, that is, an axial center of the press-fit terminal portion 4 is represented by reference sign C. Note that FIG. 12 illustrates the first region 31A where the inner wall land 31 and the press-fit terminal portion 4 are in contact with each other. The first region 31A illustrated in FIG. 12 is any of the first region 31A1 to the first region 31A4 illustrated in FIG. 4. In addition, FIG. 12 does not illustrate the second region 31B.

In the third embodiment, the first inner layer land 32A is a substantially sector with a line segment CN, which connects the radial center C of the press-fit terminal portion 4 and the circumferential center of the first region 31A, as a center line. However, the line segment CN also coincides with the direction F of the force by which the press-fit terminal portion 4 pushes the inner wall land 31. However, since the range illustrated in FIG. 12 is only 90 degrees, actually, the first inner layer land 32A has a shape obtained by combining four sectors. A contact region between the press-fit terminal portion 4 of the connector pin 11 and the inner wall land 31 has an angle ±ζ from a center of the force F by which the press-fit terminal portion 4 of the connector pin 11 pushes the inner wall land 31. Other configurations of the third embodiment are similar to those of the first embodiment, and corresponding configurations will be denoted by the same reference signs, and description thereof will be omitted.

Figure 13:
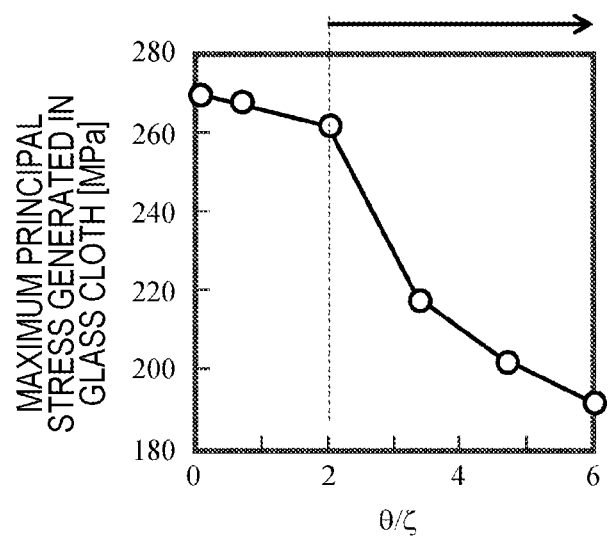
FIG. 13 is a graph illustrating the relationship between a ratio of θ and ζ and the maximum principal stress.

FIG. 13 is a graph illustrating a relationship between a ratio of θ and ζ and the maximum principal stress generated in glass cloth. As illustrated in FIG. 13, it is understood that the effect of reducing the maximum principal stress generated in the glass cloth is high when θ is larger than twice ζ. Of course, the maximum principal stress generated in the glass cloth decreases when the first inner layer land 32A is disposed in the entire circumferential direction as in the first embodiment. However, when the first inner layer land 32A is disposed over the entire circumference, an area formation of a wiring passing between adjacent through-holes decreases to reduce the degree of freedom in wiring. Therefore, a guideline to make θ larger than twice ζ is advantageous in order to reduce the maximum principal stress while maintaining the degree of freedom in wiring.

According to the above-described third embodiment, the following operational effect can be obtained in addition to the effects of the first embodiment.

(3) The first inner layer land 32A forms a substantially sector with the line segment CN, which connects the radial center C of the press-fit terminal portion 4 and the circumferential center of the first region 31A, as the center line. Therefore, a force from the press-fit terminal portion 4 can be effectively received.

(4) A radial angle θ of the first inner layer land 32A is larger than twice the angle ζ at which the press-fit terminal portion 4 is in contact with the inner wall land 31. Therefore, as illustrated in FIG. 13, it is possible to reduce the maximum principal stress while maintaining the degree of freedom in wiring and to suppress the progress of whitening.

Modification of Third Embodiment

In the third embodiment described above, the first inner layer land 32A is provided in all of the first region 31A1 to the first region 31A4. However, the first inner layer lands 32A is not necessarily provided in all the four first regions 31A. For example, the first inner layer land 32A may be provided only in the first region 31A1 and the first region 31A2, which are two adjacent regions.

Fourth Embodiment

A fourth embodiment of the circuit board according to the present invention will be described with reference to FIGS. 14 and 15. In the following description, a difference will mainly be described by applying the same reference signs to the same constituent elements as those of the first embodiment. A point not specifically described is the same as that of the first embodiment. The present embodiment is different from the first embodiment mainly in that a position of the first inner layer land 32A in the Z-direction is specified.

Figure 14:
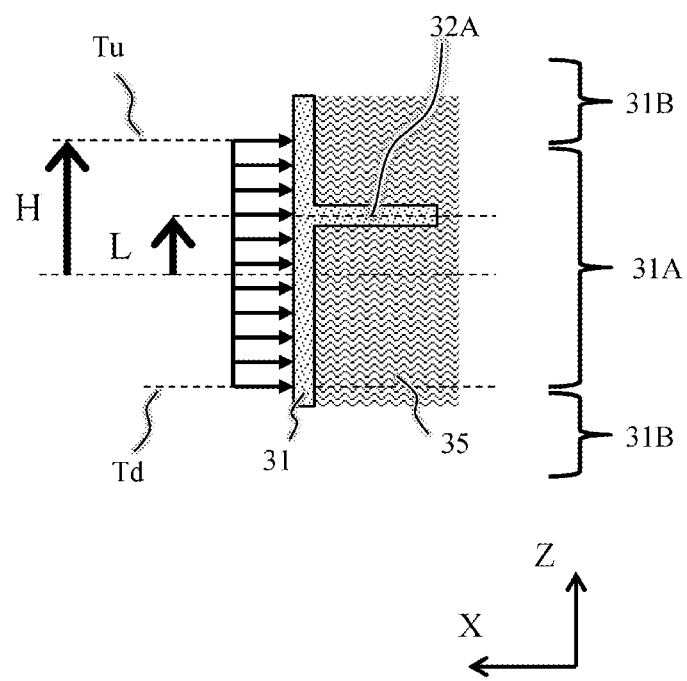
FIG. 14 is a view for describing a position of a first inner layer land in a fourth embodiment.

FIG. 14 is a view for describing the position of the first inner layer land 32A. As described in the first embodiment, the inner wall land 31 is classified into the first region 31A that is in contact with the press-fit terminal portion 4 of the connector pin 11 and the second region 31B that is not in contact with the press-fit portion. The first region 31A spreads in the Z-direction, and the first inner layer land 32A exists at an arbitrary position in the Z-direction. In the present embodiment, a distance from a center in the Z-direction to an end in the Z-direction of the first region 31A is H, and a distance from the center of the first region 31A in the Z-direction to the first inner layer land 32A is L.

For example, when L=H, a total of two first inner layer lands 32A exist, one at an upper end and one at a lower end of the first region 31A. In addition, when L=1/3H, two first inner layer lands 32A are disposed so as to equally divide the position of the first region 31A in the Z-direction into three. Further, when L=0, only one first inner layer land 32A is disposed at the center of the first region 31A in the Z-direction.

Figure 15:
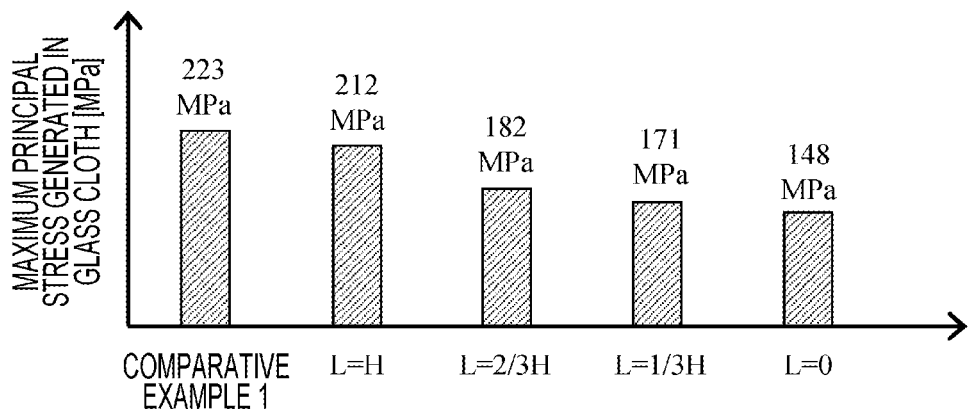
FIG. 15 is a graph illustrating the relationship between a position of the first inner layer land in a Z-direction and the maximum principal stress.

FIG. 15 is a graph illustrating a relationship between the position of the first inner layer land 32A in the Z-direction and the maximum principal stress generated in glass cloth. As illustrated in FIG. 15, the maximum principal stress generated in the glass cloth can be reduced as compared with Comparative Example 1 even when L=H. In addition, the maximum principal stress generated in the glass cloth is reduced as L decreases, and the maximum principal stress generated in the glass cloth is the minimum when L=0. Therefore, the first inner layer land 32A is desirably disposed at the center of first region 31A in the Z-direction.

According to the above-described fourth embodiment, the following operational effect can be obtained in addition to the effects of the first embodiment.

(5) The first inner layer land 32A is disposed at a center of the first region 31A in the depth direction, that is, at a position where L=0. Therefore, the apparent elastic modulus of the circuit board 3 can be increased, the maximum principal stress generated in the glass cloth can be reduced as illustrated in FIG. 15, and the effect of suppressing the progress of whitening is obtained.

Fifth Embodiment

A fifth embodiment of the circuit board according to the present invention will be described with reference to FIG.

16. In the following description, a difference will mainly be described by applying the same reference signs to the same constituent elements as those of the first embodiment. A point not specifically described is the same as that of the first embodiment. The present embodiment is different from the first embodiment mainly in that the thickness of an inner layer land is specified.

Figure 16:
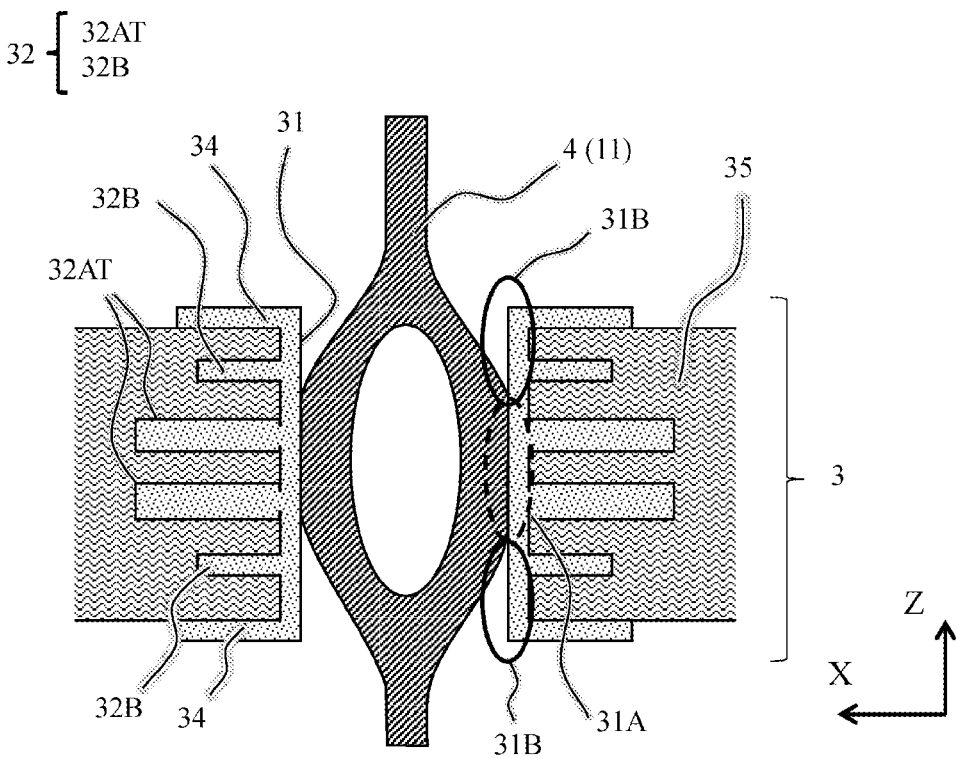
FIG. 16 is a cross-sectional view of a circuit board in a fifth embodiment.

FIG. 16 is a cross-sectional view of the circuit board 3 according to the fifth embodiment. In the present embodiment, a first inner layer land 32AT has a larger width in the Z-direction, that is, a larger thickness than the second inner layer land 32B. Therefore, the apparent elastic modulus of the circuit board can be increased to reduce the maximum principal stress generated in the glass cloth, and thus, the progress of whitening, which is the progress of the initial defect, can be suppressed.

Each of the embodiments and modifications described above may be combined. Although various embodiment and modifications have been described as above, the present invention is not limited to these contents. Other aspects conceivable within a technical idea of the present invention are also included within the scope of the present invention.

The disclosed content of the following priority application is incorporated herein as the citation.

Japanese Patent Application No. 2019-144052 (filed on Aug. 5, 2019)

REFERENCE SIGNS LIST 31 inner wall land
31A first region
31B second region
32 inner layer land
32A first inner layer land
32B second inner layer land
36 lead wire
100 electronic control device

The invention claimed is:

1. A circuit board assembly comprising:
a circuit board;
a through-hole into which a press-fit terminal portion is inserted in a depth direction;
an inner wall land provided on an inner wall of the through-hole; and
a plurality of inner layer lands which are provided in an inner layer of the circuit board, are planes substantially parallel to a mounting surface of the circuit board, and are in contact with the inner wall land,
wherein
the inner wall land has a first region that is in contact with the press-fit terminal portion and a second region that is not in contact with the press-fit terminal portion, and
among the plurality of inner layer lands, a first inner layer land, which is an inner layer land aligned with the first region of the inner wall land, is wider than a second inner layer land which is an inner layer land aligned with the second region of the inner wall land.

2. The circuit board assembly according to claim 1, wherein a lead wire electrically connected to the first inner layer land extends in an extending direction of a line segment, which connects an axial center of the press-fit terminal portion and a circumferential center of the first region, on a surface substantially parallel to the mounting surface of the circuit board.

3. The circuit board assembly according to claim 1, wherein the first inner layer land forms a substantially radial sector with a line segment, which connects an axial center of the press-fit terminal portion and a circumferential center of the first region, as a center line.

4. The circuit board assembly according to claim 3, wherein a radial angle of the first inner layer land is larger than twice an angle at which the press-fit terminal portion is in contact with the inner wall land.

5. The circuit board assembly according to claim 1, wherein the first inner layer land is disposed at a center of the first region in the depth direction.

6. The circuit board assembly according to claim 1, wherein the first inner layer land has a larger thickness in the depth direction than the second inner layer land.

* * * * *